(12) United States Patent
Shin

(10) Patent No.: US 6,839,291 B2
(45) Date of Patent: Jan. 4, 2005

(54) METHOD FOR CONTROLLING COLUMN DECODER ENABLE TIMING IN SYNCHRONOUS SEMICONDUCTOR DEVICE AND APPARATUS THEREOF

(75) Inventor: Choong-sun Shin, Sungnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 33 days.

(21) Appl. No.: 10/314,964

(22) Filed: Dec. 10, 2002

(65) Prior Publication Data

US 2003/0202385 A1 Oct. 30, 2003

(30) Foreign Application Priority Data

Apr. 27, 2002 (KR) ...................................... 2002-23273

(51) Int. Cl.[7] .............................................. G11C 8/00
(52) U.S. Cl. ................... 365/194; 365/230.06; 365/233
(58) Field of Search ........................... 365/194, 230.06, 365/233, 233.5

(56) References Cited

U.S. PATENT DOCUMENTS

| | | | | |
|---|---|---|---|---|
| 6,061,295 A | * | 5/2000 | Roh ........................... | 365/233 |
| 6,064,622 A | * | 5/2000 | Lee et al. .............. | 365/230.06 |
| 6,151,270 A | * | 11/2000 | Jeong ......................... | 365/233 |
| 6,154,417 A | * | 11/2000 | Kim ........................... | 365/233 |
| 6,163,498 A | * | 12/2000 | Moon .................... | 365/230.06 |
| 6,529,423 B1 | * | 3/2003 | Yoon et al. ................. | 365/194 |

* cited by examiner

*Primary Examiner*—Tan T. Nguyen
(74) *Attorney, Agent, or Firm*—Harness, Dickey & Pierce, P.L.C.

(57) ABSTRACT

A method for controlling column decoder enable timing including determining if there is a gap between a data write command and a data read command which occur consecutively; generating a timing control signal for delaying received clock signal for an amount of time which depends on the determination result; and activating a column decoder in response to the timing control signal. Generating a timing control signal includes generating a timing control signal having a first delay time if there is a gap and generating a timing control signal having a second delay time if there is no gap, when the first delay time is shorter than the second delay time. An effect is an increase in the maximum operating frequency of a system for outputting data.

30 Claims, 7 Drawing Sheets

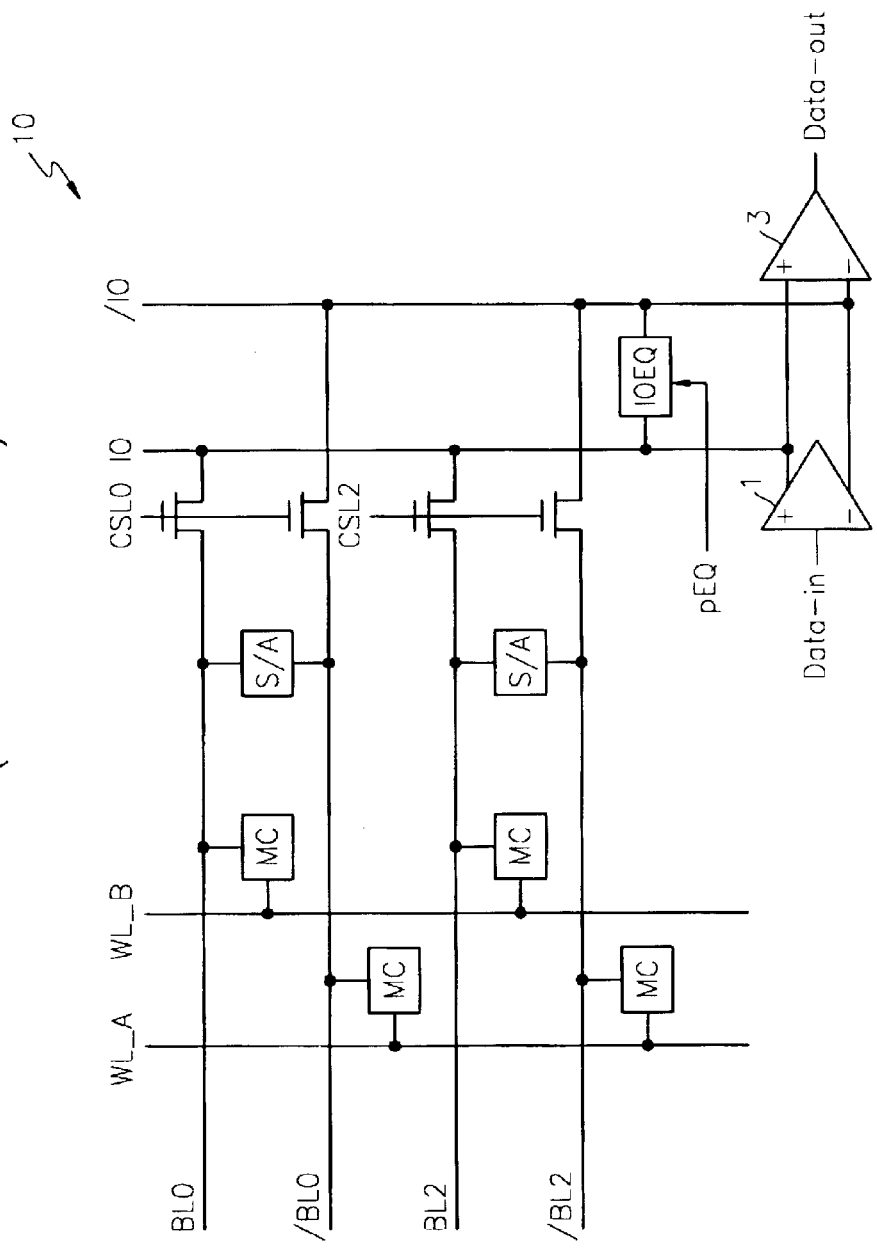
FIG. 1 (CONVENTIONAL)

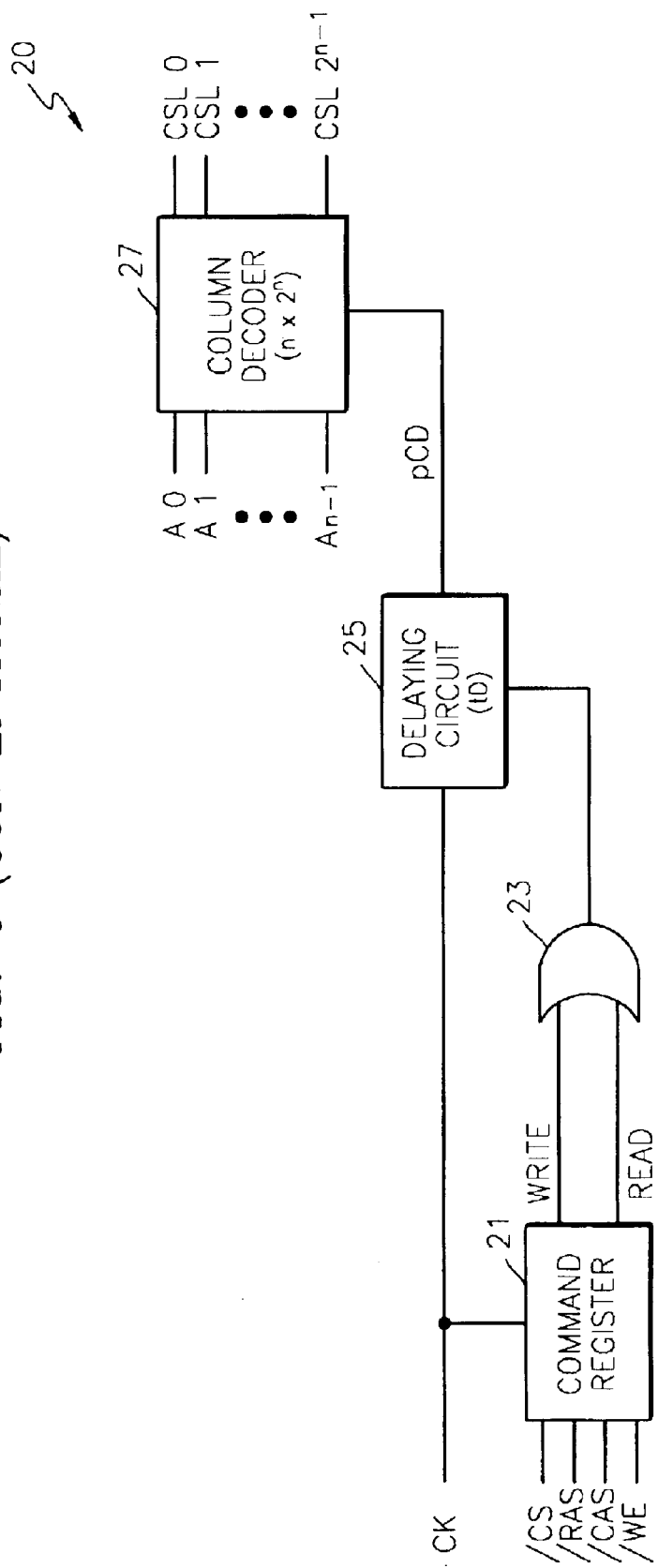
FIG. 2 (CONVENTIONAL)

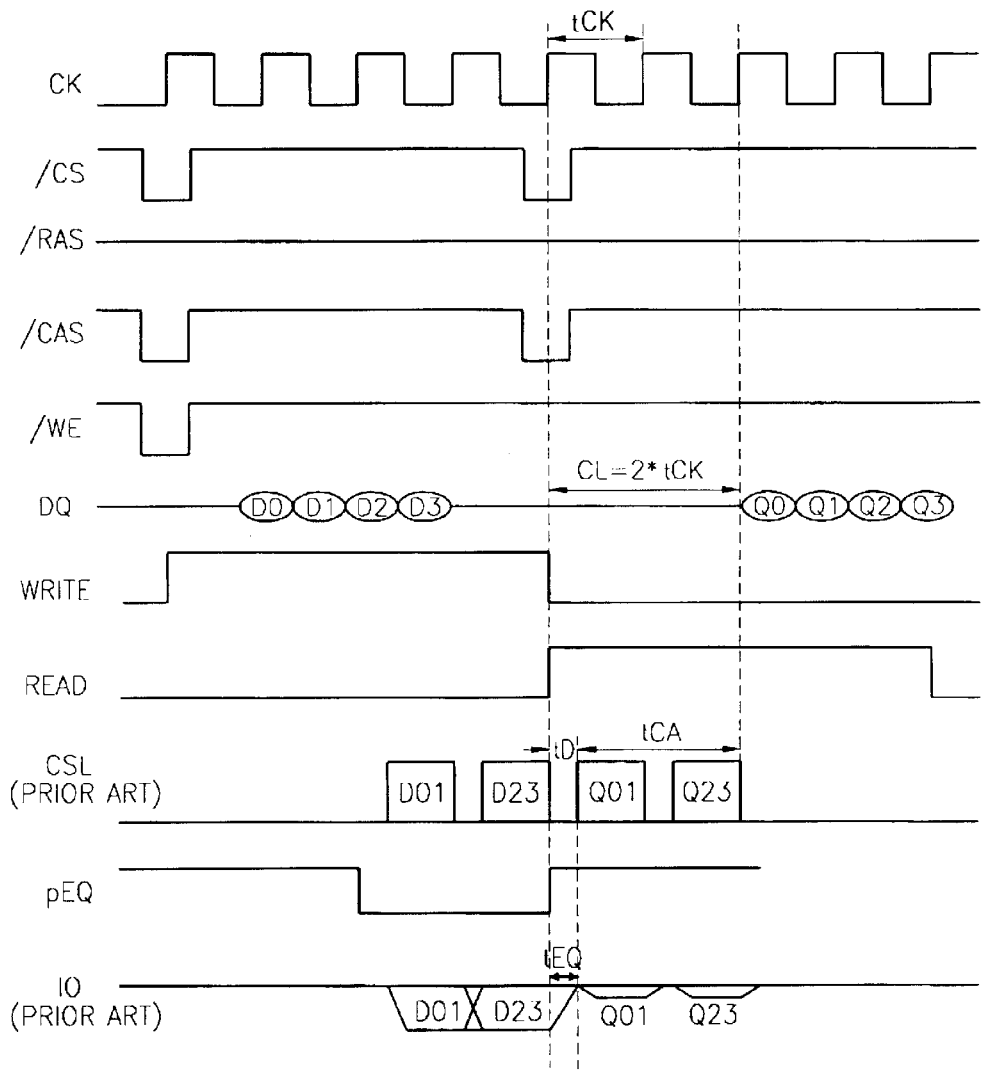
FIG. 3 (CONVENTIONAL)

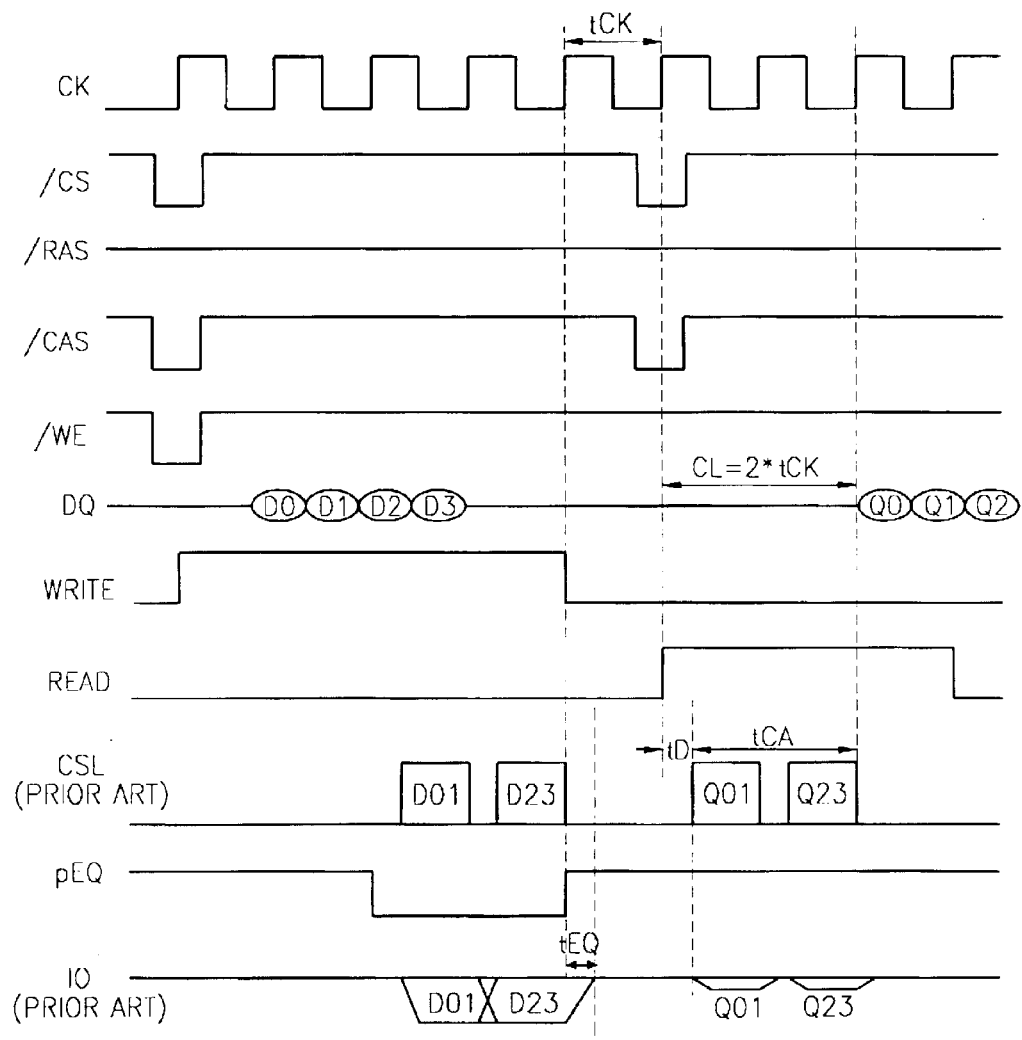
FIG. 4 (CONVENTIONAL)

METHOD FOR CONTROLLING COLUMN DECODER ENABLE TIMING IN SYNCHRONOUS SEMICONDUCTOR DEVICE AND APPARATUS THEREOF

BACKGROUND OF THE INVENTION

1. Field of the Invention

The present invention relates to a semiconductor memory device, and more particularly, to a method and a device for increasing a maximum operating frequency if there is a gap between a data write command signal and a data read command signal.

2. Description of the Related Art

FIG. 1 is a schematic data input and output circuit 10 of a conventional DRAM. The input and output circuit 10 of FIG. 1 includes bit lines BLO, /BLO ("/" indicates an active low), BL2 and /BL2, memory cells MC contacting intersection points of word lines WL_A and WL_B, sensing amplifiers S/A, data input and output lines IO and /IO, equalizing circuits IO EQ for equalizing the data input and output lines IO and /IO, a data input buffer 1, and a data output buffer 3. The equalizing circuits IO EQ are activated in response to a control signal pEQ.

FIG. 2 is a block diagram of a conventional column selection circuit. The column selection circuit 20 includes a command register 21, an OR gate 23, a delay circuit 25 and a column decoder 27.

The command register 21 responds to a clock signal CK, a chip selection signal /CS, a row address strobe /RAS, a column address strobe /CAS and a write enable /WE, generates a write command signal WRITE or a read command signal READ and outputs the write command signal WRITE or read command signal READ to the OR gate 23.

The OR gate 23 logically ORs the write command signal WRITE and the read command signal READ and outputs the result to the delay circuit 25. The delay circuit 25 responds to an output signal of the OR gate 23, delays the clock signal CK for a desired time tD, and outputs the delayed signal as a timing control signal pCD to the column decoder 27. The column decoder 27 receives and decodes n column addresses A0 through A(n−1) and selects one column signal line among 2n column signal lines CSL0 through CSL($2^{n-1}$). The column decoder 27 controls the activation timing of the column selection signal line in response to the timing control signal pCD.

Referring to FIGS. 1 and 2, data is written into a memory cell as follows. If the command register 21 outputs the data write command signal WRITE in response to the command signals CK, /RAS, /CAS and /WE, the delay circuit 25 responds to an output signal of the OR gate 23, delays the clock signal CK for the desired time tD, and outputs the delayed signal as a timing control signal pCD to the column decoder 27.

If the column decoder 27 selects and activates the column selection signal line CSL0 in response to the timing control signal pCD, input data Data-in is written into a memory cell MC through the input buffer 1, the data input and output lines IO and /IO and the bit lines BLO and /BLO.

However, if the command register 21 outputs the data read command signal READ in response to the command signals CK, /RAS, /CAS and /WE and the delay circuit 25 delays the clock signal CK for the desired time tD and outputs the delayed signal as the timing control signal pCD to the column decoder 27 in response to an output signal of the OR gate 23.

If the column decoder 27 selects and activates a column signal line CSL0 in response to the timing control signal pCD, data stored in a memory cell MC is output to a sensing amplifier S/A through the bit lines BLO and /BLO, the sensing amplifier S/A amplifies the received data and outputs output data Data-out through the data input and output lines IO and /IO and output buffer 3.

FIG. 3 is a timing diagram of data input and output in a case where there is no gap between the data write command signal WRITE and the data read command signal READ, i.e., in a case where the data read command signal READ is activated within one period tCK of the clock signal CK after the data write command signal WRITE is inactivated and further a case that the data write command signal WRITE is interrupted by the data read command signal READ.

Referring to FIGS. 1 through 3, in the case where the data input and output lines IO and /IO are not equalized after the data D23 is written in the memory cells MCs, and read data Q01 stored in the memory cells MCs, since the data D23 which is remaining on the data input and output lines IO and /IO is written to the bit lines on the data Q01, data Q01 to be read is lost.

To prevent this problem, the delay time tD of the delay circuit 25 is set to be more than an equalizing time tEQ required for being equalized to the data input and output lines IO and /IO. The equalizing time tEQ is required for write-read operations which occur consecutively in a case where there is no gap between the data write command signal WRITE and the data read command signal READ as shown in FIG. 3.

FIG. 4 is a timing diagram showing data input and output lines in a case where there is a gap of one clock signal period between the data write command signal and the data read command signal. Referring to FIG. 4, a gap indicates the case where the data read command signal READ is activated after the data write command signal WRITE is inactivated and one period tCK of the clock signal. Accordingly, in the case where there is a gap, a continuous write-read operation does not require equalization time tEQ.

Referring to FIGS. 1, 2 and 4, if the delay time for activating the column selection signal line CSL after the clock signal CK is input into the column selection circuit 20 is referred to as tD, and the delay time for outputting data after the column selection signal line CSL is activated is referred to as tCA, the maximum operating frequency of an SDRAM having a CAS latency CL of 2 clock periods (2*tCK) is obtained by Equation 1.

$$1/CK = 2/(tD + tCA) \qquad (1)$$

In order to increase the maximum operating frequency of an SDRAM having a CL of 2, tCA or/and tD should be decreased. Here, if tCA is fixed, tD should be decreased to increase the maximum operating frequency of the SDRAM having a CL of 2. However, tD must be more than the equalizing time tEQ.

Accordingly, since the delay time tD of the delay circuit 25 is fixed in FIG. 2, the maximum operating frequency of an SDRAM having a CL of 2 is obtained by Equation 1, regardless of whether there is a gap between the data command signal and data read command signal.

Therefore, a user cannot increase the maximum operating frequency of an SDRAM having a CL of 2 in the case of performing write-read operations in order.

SUMMARY OF THE INVENTION

In an exemplary embodiment, the present invention provides a method for increasing the maximum operating frequency of a semiconductor device in the case of performing write-read operations in order and a device thereof.

In another exemplary embodiment, the present invention is directed to a method for controlling column decoder enable timing, the method comprising: determining if there is a gap between a data write command and a data read command which occur consecutively; generating a timing control signal for delaying received clock signal for an amount of time which depends on the determination result; and activating a column decoder in response to the timing control signal. The step of generating timing control signal may comprise generating a timing control signal having a first delay time if there is a gap and generating a timing control signal having a second delay time if there is no gap.

The column decoder enabling timing control method may further comprise decoding addresses input in response to the timing control signal and generating a column select signal corresponding to a decoding result by the column decoder; and outputting data on a pair of bit lines corresponding to the decoded addresses to a pair of input and output lines in response to the column selection signal.

In addition, the method for controlling column decoder enable timing may comprise delaying an input data write command signal for one period of a clock signal in response to the clock signal; and determining if the delayed data write command signal and a currently input data read command signal are activated at the same time, and, if the delayed data write command signal and the currently input data read command signal are not activated at the same time, generating a timing control signal delaying the clock signal for a first delay time, and if the delayed data write command signal and the currently input data read command signal are activated at the same time, generating a timing control signal delaying the clock signal for a second delay time; and activating a column decoder in response to the timing control signal.

The first delay time may be shorter than the second delay time. The method may further comprise decoding with the column decoder addresses input in response to the timing control signal and generating in the column decoder a column selection signal corresponding to a decoding result; and outputting data on a pair of bit lines corresponding to the addresses to a pair of input and output lines in response to the timing control signal.

Furthermore, a method for controlling column decoder enable timing may comprise generating a timing control signal by delaying a clock signal for a first delay time if a data read command is activated after a data write command is deactivated and one period of the clock signal, and generating a timing control signal by delaying the clock signal for a second delay time if a data read command is activated within one clock period of the clock signal after the data write command is activated; and activating a column decoder in response to the timing control signal.

The first delay time may be shorter than the second delay time. The method may further comprise decoding addresses input in response to the timing control signal and generating a column selection signal corresponding to a decoding result by the column decoder; and outputting data on a pair of bit lines corresponding to the addresses to a pair of input and output lines in response to the column selection signal. Here, the second delay time may be longer than the time for equalizing the pair of input/output data.

In another exemplary embodiment, the present invention is also directed to a column decoder operable in a first mode and a second mode, wherein the column decoder is activated in response to a timing control signal generated by delaying a received clock signal for a first delay time in the first mode; and the column decoder is activated in response to a timing control signal generated by delaying the received clock signal for a second delay time in the second mode.

The first mode may be a mode in which there is gap between a data write command signal and a data read command signal which occur consecutively, and the second mode is a mode in which there is no gap between the data write command signal and the data read command signal.

The first mode may be a mode in which a data read command is activated after the deactivation of the data write command and one period of the clock signal, and the second mode is a mode in which a data read command is activated within one period of the clock signal after the deactivation of the data write command.

The column decoder may decode addresses input in response to the timing control signal and generates a column select signal corresponding to the decoding result.

In another exemplary embodiment, the present invention is also directed to a semiconductor memory device, comprising; a column decoder for decoding addresses input in response to a timing control signal and generating a column select signal corresponding to the decoding result; and a timing control signal generating circuit for generating the timing control signal, wherein the timing control signal generating circuit generates the timing control signal by delaying a received clock signal by an amount of time which depends on whether there is a gap between a data write command signal and data read command signal which occur consecutively.

In the exemplary semiconductor memory device if there is a gap, the timing control signal generating circuit may generate a timing control signal by delaying the clock signal for a first delay time, and if there is no gap, the timing control signal generating circuit may generate a timing control signal by delaying the clock signal for a second delay time which is longer than the first delay time.

In an exemplary embodiment, the present invention is also directed to a semiconductor memory device which comprises a column decoder for decoding addresses input in response to a timing control signal and generating a column selection signal corresponding to the decoding result; and a timing control signal generating circuit for generating the timing control signal, wherein the timing control signal generating circuit generates the timing control signal by delaying the clock signal for a first delay time if a data read command is activated after the data write command is deactivated and N periods of the clock signal, and generates the timing control signal by delaying the clock signal for a second delay time if a data read command is activated within N periods of the clock signal after the data write command is deactivated. The first delay time is shorter than the second delay time. N may be 1 or greater. The semiconductor memory device may comprise a pair of bit lines for inputting and outputting data in a memory cell; and a pair of lines for inputting and outputting data, wherein the data on the pair of bit lines are transmitted to the pair of lines for inputting and outputting in response to the column selection signal.

In another exemplary embodiment, the present invention is also directed to a semiconductor memory device comprising a column decoder for decoding addresses input in response to a timing control signal and generating a column select signal corresponding to the decoding result; a delay circuit for delaying the data write command signal for one period of a clock signal in response to the clock signal; a first control circuit for receiving a data read command signal and an output signal of the delay circuit and outputting a control signal; and a second control circuit for generating the timing control signal by delaying the received clock signal for a first delay time if the control signal is activated, and for generating the timing control signal by delaying the clock signal for a second delay time if the control signal is not activated.

BRIEF DESCRIPTION OF THE DRAWINGS

The present invention will become more apparent by describing in detail exemplary embodiments thereof with reference to the attached drawings in which:

FIG. 1 is a schematic input and output circuit of a conventional DRAM.

FIG. 2 is a block diagram of a conventional column selection circuit.

FIG. 3 is a timing diagram of data input and output in a case where there is no gap between a data write command signal and a data read command signal.

FIG. 4 is a timing diagram of data input and output in a case where there is a first clock signal period between a data write command signal and a data read command signal.

DETAILED DESCRIPTION OF EXEMPLARY EMBODIMENTS OF THE INVENTION

Figure 5:
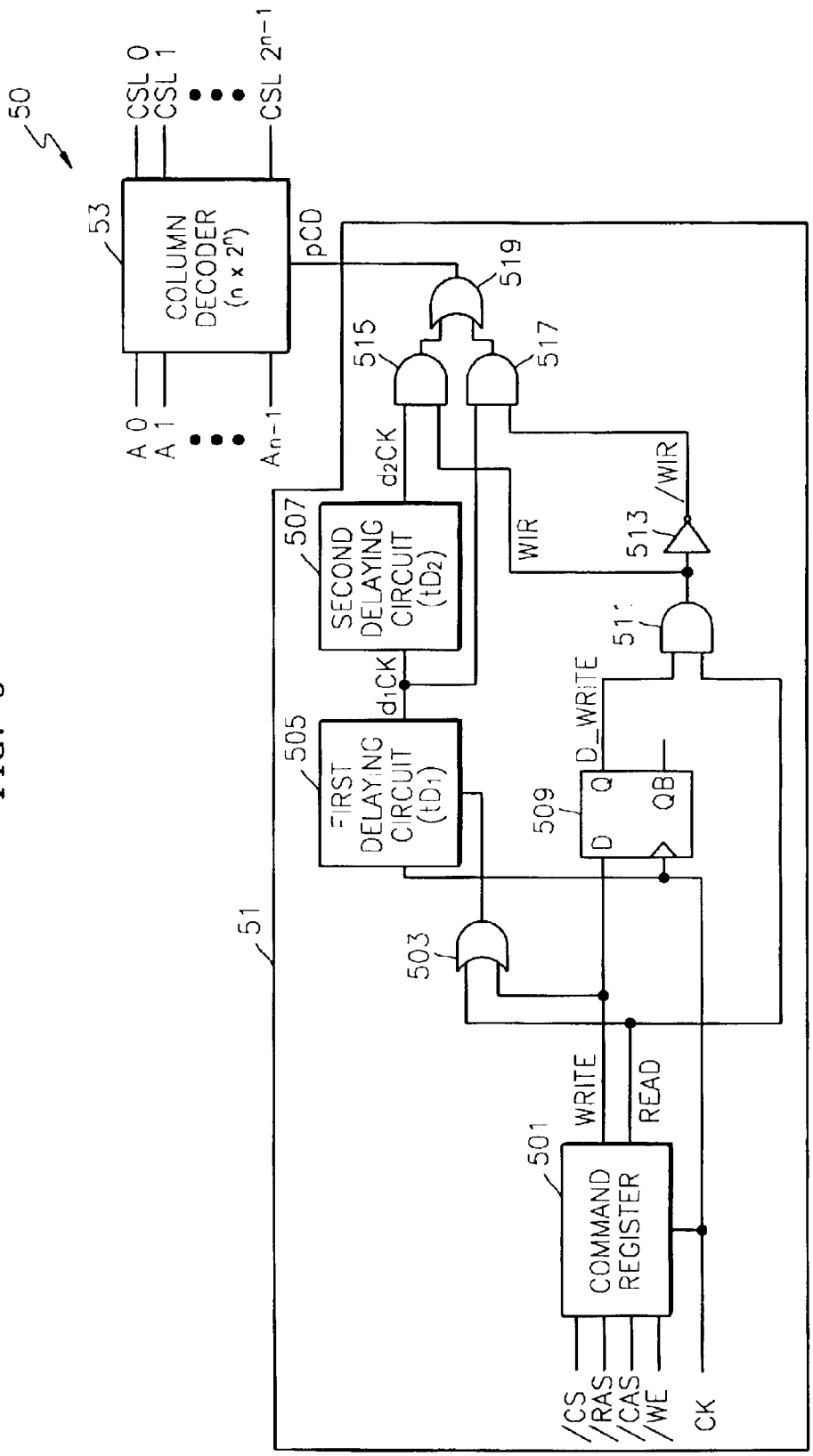
FIG. 5 is a block diagram of a column selection circuit according to an exemplary embodiment of the present invention.

The present invention will now be described more fully with reference to the accompanying drawings, in which exemplary embodiments of the invention are shown. This invention may, however, be embodied in many different forms and should not be construed as being limited to the exemplary embodiments set forth herein; rather, these exemplary embodiments are provided so that this disclosure will be thorough and complete and, will fully convey the concept of the present invention to those skilled in the art. In the drawings, the thickness of layers and regions are exaggerated for clarity. Like reference numerals in different drawings refer to like elements.

FIG. 5 is a block diagram of a column selection circuit 50 according to an exemplary embodiment of the present invention. Referring to FIG. 5, the column selection circuit 50 includes a timing control signal generating circuit 51 and a column decoder 53.

The timing control signal generating circuit 51 delays the clock signal CK for a desired time and outputs the delayed signal as a timing control signal pCD to the column decoder 53 in response to a clock signal CK, a row address strobe /RAS, a column address strobe /CAS, and a write enable signal /WE.

The column decoder 53, responding to the timing control signal pCD, decodes input addresses and activates (high) a column selection signal corresponding to the results of the decoding, among the column selection signals CSL0 through CSL($2^{n-1}$). The column selection signal is a signal on a column selection signal line, thus it can be used synonymously with the column selection signal line. The timing control signal generating circuit 51 includes a command register 501, a first logic gate 503, a first delay circuit 505, a second delay circuit 507, a third delay circuit 509, a sensing circuit 511, a second logic gate 513, a third logic gate 515, a fourth logic gate 517 and a fifth logic gate 519.

The exemplary embodiment of the present invention illustrated in FIG. 5 embodies the sensing circuit 511, the third logic gate 515 and the fourth logic gate 517 as an AND gate, and the first logic gate 503 and the fifth logic gate 519 as an OR gate, but other equivalent circuits are well within the ability of one or ordinary skill.

The command register 501 receives a clock signal CK, a row address strobe /RAS, a column address strobe /CAS, and a write enable signal /WE and outputs a data write command signal WRITE or a data read command signal READ, in response to the logic state of each signal /RAS, /CAS and /WE.

The first logic gate 503 receives and logically ORs the data write command signal WRITE and the data read command signal READ output from the command register 501, and outputs the result to the first delay circuit 505.

The first delay circuit 505 receives the output signal of the first logic gate 503 and the clock signal CK, delays the clock signal CK for a desired delay time tD1, and outputs a first delay signal d1CK to the second delay circuit 507 and the fourth logic gate 517.

The second delay circuit 507 receives the first delay signal d1CK, delays the first delay signal d1CK for a desired delay time tD2, and outputs the delayed signal as a second delay signal d2CK to the third logic gate 515.

The third delay circuit 509 is clocked by the clock signal CK, delays the data write command signal WRITE for N (N is a natural number) periods of the clock signal CK, and output the delayed signal as a delayed data write command signal D-WRITE to the sensing circuit 511. In an exemplary embodiment of the present invention, N is equal to 1.

If the third delay circuit 509 is embodied as a D-flip flop (an exemplary implementation), the data write command signal WRITE is input into an input terminal of the D-flip flop 509, and the input data write command signal WRITE is transmitted to the sensing circuit 511 through an output terminal Q in response to the clock signal CK. The delayed data write command signal D-WRITE is a signal obtained by delaying the data write command signal WRITE for one period.

The sensing circuit 511 receives and logically ANDs the delayed data write command signal D-WRITE and the data read command signal READ, and outputs the result, i.e., a sensing signal WIR, to the second logic gate 513 and the third logic gate 515.

In other words, if the delayed data write command signal D-WRITE and the data read command signal READ are activated, i.e., go to logic high, at the same time, the sensing circuit 511 outputs the activated sensing signal WIR to the second logic gate 513 and the third logic gate 515. The sensing circuit 511 determines if there is a gap between the data write command signal WRITE and the data read command signal READ which continuously occur.

The second logic gate 513, which can be exemplarily embodied as an inverter, receives and inverts the output signal WIR of the sensing circuit 511 and outputs the inverted sensing signal /WIR to a fourth logic gate 517.

The third logic gate 515 receives and logically ANDs the output signal d2CK of the second delay circuit 507 and the output signal WIR of the sensing circuit 511, and outputs the result to a fifth logic gate 519.

The fourth logic gate 517 receives and logically ANDs the output signal d1CK of the first delay circuit 505 and the output signal /WIR of the second logic gate 513 and outputs the result to the fifth logic gate 519.

The fifth logic gate 519 receives and logically ANDs the output signal of the third logic gate 515 and the output signal of the fourth logic gate 517 and outputs the result, i.e., a timing control signal pCD, to the column decoder 53.

In other words, the fifth logic gate 519 outputs either the output signal d1Ck of the first delay circuit 505 or the output signal d2CK of the second delay circuit 507 depending on whether the sensing signal WIR is activated or not.

Accordingly, the fifth logic gate 519 generates a timing control signal pCD by delaying the received clock signal CK for the first delay time tD1 or the second delay time tD1+tD2, depending on whether there is a gap between the data write command signal WRITE and the data read command signal READ.

A timing control signal generating circuit 51 which generates a timing control signal pCD include the circuit devices 505, 507, 513, 515, 517 and 519. Accordingly, the timing control signal generating circuit 51 generates a timing control signal pCD by delaying the clock signal CK for the first time tD1, if the data read command signal READ is activated within N (N is a natural number) periods of the clock signal CK after the data write command signal WRITE is deactivated.

In addition, if the data read command signal READ is activated within N periods of the clock signal CK after the data write command signal WRITE is deactivated, the timing control signal generating circuit 51 generates a timing control signal pCD by delaying the clock signal for the second delay time tD1+tD2.

Responding to the timing control signal pCD, the column decoder 53 receives and decodes an n (n is a natural number) column address A0 through A(n−1), and, corresponding to the result of decoding, selects one column selection line from among 2n column selection lines CSL0 through CSL ($2^{n-1}$).

In other words, the column decoder 50 activates in response to a timing control signal pCD by delaying the received clock signal CK for the time tD1 if there is a gap between the data write command signal WRITE and the data read command signal READ which occur consecutively (referred to as "a first mode").

In addition, the column decoder 50 activates in response to a timing control signal pCD by delaying the received clock signal CK for the second time tD1+tD2, if there is no gap between the data write command signal WRITE and the data read command signal READ which occur consecutively (referred to as "a second mode").

In an exemplary embodiment of the present invention, delays due to each of the circuit devices 501, 503, 511, 513, 515, 517 and 519 are insignificant and can be ignored. Referring to FIGS. 1 and 5, a semiconductor memory device including the column selection circuit 50 will now be described. The semiconductor memory device includes a pair of bit lines and a pair of data input and output lines for inputting and outputting data to/from memory cells, and the data on the pair of bit lines are transmitted to the pair of data input and output lines in response to an output signal of the column decoder 53.

The circuit for inputting and outputting data in a semiconductor memory device including a column selection circuit 50 according to exemplary embodiments of the present invention is substantially the same as the one for inputting and outputting data in FIG. 1, so it will be described with reference to the circuit 10 for inputting and outputting data in FIG. 1. However, the exemplary embodiments of the semiconductor memory device of the present invention including the column selection circuit 50 is not limited by FIG. 1. The column selection signal (or a column selection signal line) CSL0 may be selected and activated as follows.

The selected column selection signal CSL0 turns on a desired switch and electrically connects the pair of bit lines BL0 and /BL0 to the pair of data input and output lines IO and /IO, respectively. Accordingly, data stored in a memory cell MC is externally output through the pair of bit lines BL0 and /BL0, a sensing amplifier S/A, the pair of data input/output lines IO and /IO, and an output buffer 3.

In addition, data input externally is stored in the memory cell MC through the input buffer 1, the pair of data input and output lines IO and /IO, and the pair of bit lines BL0 and /BL0.

Figure 6:
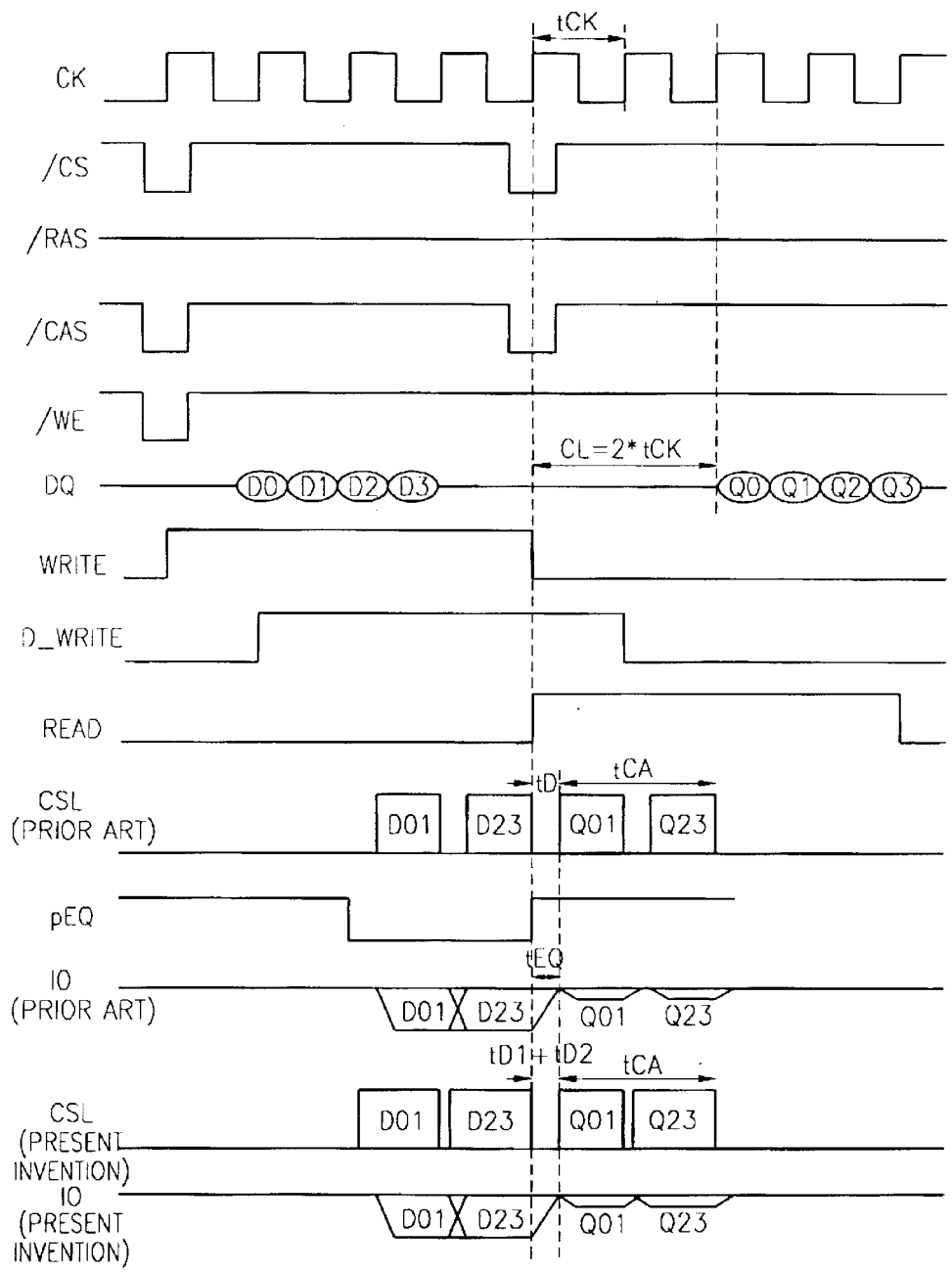
FIG. 6 is a timing diagram of data input and output in a case where there is no gap between a data write command signal and a data read command signal according to an exemplary embodiment of the present invention.

FIG. 6 is a timing diagram of data input and output in a case where there is no gap between the data write command signal and the data read command signal according to an exemplary embodiment of the present invention. Here, data D0 through D3 indicate input data and data Q0 through Q3 indicate output data. The data D01 indicates a column selection signal for writing the data D0, D1 on the data input and output line to the memory cells. The data Q01 indicates a column selection signal for reading the data Q0, Q1 on the data input and output line.

Referring to FIGS. 5 and 6, the command register 501 generates and outputs a data write command signal WRITE in response to a high to low transition of /CS, /RAS, /CAS and /WE.

The delay circuit 509 receives the data write command WRITE, delays it for one clock period tCK and outputs a delayed data write command D_WRITE in response to a clock signal CK. Here, the sensing circuit 511 logically ANDs the activated delayed data write command D_WRITE and the activated data read command READ and outputs an activated sensing signal WIR. The activated sensing signal WIR indicates that the delayed data write command D_WRITE and the data read command READ are enabled at the same time. In other words, the data read command signal READ is activated within one period tCK of the clock signal after the data write command WRITE is deactivated. Therefore write-read operations are performed in order without a gap.

The third logic gate 515 outputs a clock signal delayed for the desired time tD1+tD2 by the first delay circuit 505 and the second delay circuit 507. Therefore, the timing control signal pCD is obtained by delaying the clock signal CK for the desired time tD1+tD2.

The second logic gate 513 outputs a deactivated inversion sensing signal /WIR and the fourth logic gate 517 is deactivated. If the sensing signal WIR is activated, equalizing time is required. The delay time tD1 and tD2 is represented by Equation 2.

$$tD=tEq=(tD1+tD2) \qquad (2)$$

Figure 7:
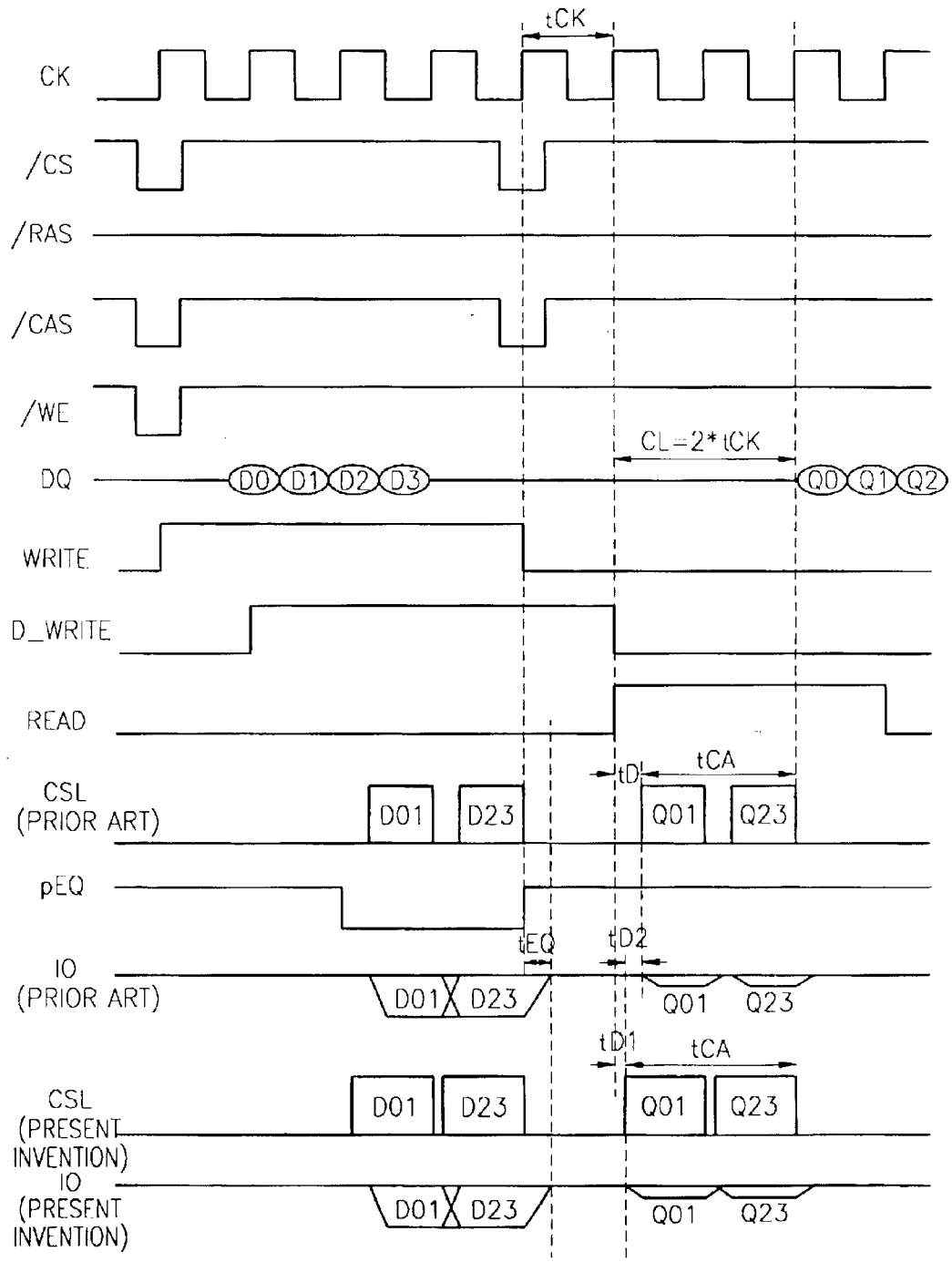
FIG. 7 is a timing diagram of data input and output in a case where there is a first clock signal period between a data write command signal and a data read command signal according to an exemplary embodiment of the present invention.

FIG. 7 is a timing diagram of data input and output in a case where there is one clock signal period between a data write command signal and a data read command signal.

Referring to FIGS. 5 and 7, the command register 501 outputs a data write command signal WRITE in response to a high to low transition of /CS, /RAS, /CAS and /WE.

The delay circuit 509, responding to a clock signal CK, receives the data write command WRITE, delays it for one clock period tCK and outputs a delayed data write command D_WRITE. The sensing circuit 511 logically ANDs the activated delaying data write command D_WRITE and the activated data read command READ and outputs an activated sensing signal WIR. The third logic gate 515 is deactivated and the second logic circuit 513 outputs an activated inversion sensing signal /WIR.

The deactivated sensing signal WIR indicates that there is a gap of more than one clock period tCK between the delayed data write command D_WRITE and the data read command READ. In other words, the data read command signal READ is activated after one period tCK of the clock signal and the data write command WRITE is deactivated. Therefore write-read operations are performed in order without a gap.

The fourth logic gate 515 logically ANDs the first delay signal d1CK delayed for a desired time tD by the first delay circuit 505 and the output signal of the second logic gate 513, and outputs the result to the fifth logic gate 519. Therefore, a timing control signal pCD obtained by delaying the clock signal CK for the desired time tD1 is output to the column decoder.

The first and second delay time tD1 and tD2 is represented by Equation 3.

$$tD2 = tD + tD1 \tag{3}$$

Accordingly, the maximum operating frequency of an SDRAM having a CL of 2 clock periods (2*tCK) is represented by Equation 4.

$$1/CK = 2/(tD1 + tCA) \tag{4}$$

Therefore, the maximum operating frequency of the column decoder 53, and a semiconductor memory device including a timing control signal generating circuit 51 according to exemplary embodiments of the present invention is higher than that of a semiconductor memory device including a conventional column selection such as circuit 20 represented in Equation 1.

Referring to FIGS. 2 and 6, the maximum operating frequency of a semiconductor memory device including the column selection circuit 50 according to exemplary embodiments of the present invention is the same as that of a semiconductor memory device including a conventional column selection circuit such as circuit 20.

Referring to FIGS. 4 and 7, the maximum operating frequency of a semiconductor memory device including the column selection circuit 50 according to exemplary embodiments of the present invention is higher than that of a semiconductor memory device including a conventional column selection circuit such as circuit 20 represented in Equation 1.

As described above, the method and the device for controlling a column decoder enabling timing according to exemplary embodiments of the present invention increase a maximum operating frequency of a semiconductor memory device.

It is noted that the present invention has been described in the context of a data write command signal WRITE and a consecutive data read command signal READ. However, the teachings of the various exemplary embodiments of the present invention can be applied to any other pair of consecutive signals in any order.

It is noted that the present invention is not limited to the exemplary embodiment described above, and it is apparent that variations and modifications can be made by those skilled in the art within the spirit and scope of the present invention defined in the appended claims.

What is claimed is:

1. A method for controlling column decoder enable timing, the method comprising:

determining if there is a gap between a data write command and a consecutive data read command;

generating a timing control signal for delaying a received clock signal for an amount of time which depends on the determination result; and activating a column decoder in response to the timing control signal.

2. The method of claim 1, wherein the generation of the timing control signal comprises generating a timing control signal having a first delay time if there is a gap and generating a timing control signal having a second delay time if there is no gap.

3. The method of claim 2, wherein the first delay time is shorter than the second delay time.

4. The method of claim 1, further comprising:

decoding addresses input in response to the timing control signal and generating a column select signal corresponding to a decoding result by the column decoder; and outputting data on a pair of bit lines corresponding to the decoded addresses to a pair of input and output lines in response to the column selection signal.

5. A method for controlling column decoder enable timing, comprising:

delaying an input data write command signal for one period of a clock signal in response to the clock signal; and determining if the delayed data write command signal and a currently input data read command signal are activated at the same time, wherein, if the delayed data write command signal and the currently input data read command signal are not activated at the same time, generating a timing control signal delaying the clock signal for a first delay time, and if the delayed data write command signal and the currently input data read command signal are activated at the same time, generating a timing control signal delaying the clock signal for a second delay time; and activating a column decoder in response to the timing control signal.

6. The method of claim 5, wherein the first time is shorter than the second time.

7. The method of claim 5, further comprising:

decoding with the column decoder addresses input in response to the timing control signal and generating in the column decoder a column selection signal corresponding to a decoding result; and outputting data on a pair of bit lines corresponding to the addresses to a pair of input and output lines in response to the column selection signal.

8. A method for controlling column decoder enable timing, comprising:

generating a timing control signal by delaying a clock signal for a first delay time if a data read command is activated after a data write command is deactivated and one period of the clock signal, and generating a timing control signal by delaying the clock signal for a second delay time if a data read command is activated within one clock period of the clock signal after the data write command is activated; and activating a column decoder in response to the timing control signal.

9. The method of claim 8, wherein the first delay time is shorter than the second delay time.

10. The method of claim 8, further comprising;

decoding addresses input in response to the timing control signal and generating a column selection signal corresponding to a decoding result by the column decoder; and outputting data on a pair of bit lines corresponding to the addresses to a pair of input and output lines in response to the column selection signal.

11. The method of claim 10, wherein the second delay time is longer than a time for equalizing the pair of input and output data lines.

12. A column decoder activated in response to delaying a received clock signal for a first delay time in a first mode; and activated in response to delaying the received clock signal for a second delay time in a second mode, wherein the first mode is a mode in which there is a gap between a data write command signal and a data read command signal.

13. The column decoder of claim 12, wherein the data write command signal and the data read command signal occur consecutively, and the second mode is a mode in which there is no gap between the data write command signal and the data read command signal.

14. The column decoder of claim 12, wherein the first delay time is shorter than the second delay time.

15. The column decoder of claim 12, wherein the first mode is a mode in which a data read command is activated after the deactivation of the data write command and one period of the clock signal, and the second mode is a mode in which a data read command is activated within one period of the clock signal after the deactivation of the data write command.

16. The column decoder of claim 12, wherein the column decoder decodes addresses input in response to the delayed received clock signal and generates a column select signal corresponding to the decoding result.

17. A semiconductor memory device, comprising;

a column decoder for decoding addresses input in response to a timing control signal and generating a column select signal corresponding to the decoding result; and a timing control signal generating circuit for generating the timing control signal, wherein the timing control signal generating circuit generates the timing control signal by delaying a received clock signal by an amount of time which depends on whether there is a gap between a data write command signal and a consecutive data read command signal.

18. The device of claim 17, wherein if there is the gap, the timing control signal generating circuit generates a timing control signal by delaying the clock signal for a first delay time, and if there is no gap, the timing control signal generating circuit generates a timing control signal by delaying the clock signal for a second delay time which is longer than the first delay time.

19. The device of claim 17, wherein the semiconductor memory device further comprises a command register which outputs the data read command signal or the data write command signal in response to a clock signal and a write enable signal.

20. A semiconductor memory device, comprising:

a column decoder for decoding addresses input in response to a timing control signal and generating a column selection signal corresponding to the decoding result; and a timing control signal generating circuit for generating the timing control signal, wherein the timing control signal generating circuit generates the timing control signal by delaying the clock signal for a first delay time if a data read command is activated after the data write command is deactivated and N periods of the clock signal, and generates the timing control signal by delaying the clock signal for a second delay time if a data read command is activated within N periods of the clock signal after the data write command is deactivated.

21. The device of claim 20, wherein the first delay time is shorter than the second delay time.

22. The device of claim 20, wherein the semiconductor memory device comprises:

a pair of bit lines for inputting and outputting data in a memory cell; and a pair of lines for inputting and outputting data, wherein the data on the pair of bit lines are transmitted to the pair of lines for inputting and outputting in response to the column selection signal.

23. The device of claim 20, wherein the semiconductor memory device further comprises a command register for outputting the data read command signal or the data write command signal in response to a clock signal or a write enable signal.

24. A semiconductor memory device, comprising;

a column decoder for decoding addresses input in response to a timing control signal and generating a column select signal corresponding to the decoding result;

a delay circuit for delaying the data write command signal for one period of a clock signal in response to the clock signal;

a first control circuit for receiving a data read command signal and an output signal of the delay circuit and outputting a control signal; and a second control circuit for generating the timing control signal by delaying the received clock signal for a first delay time if the control signal is activated, and for generating the timing control signal by delaying the clock signal for a second delay time if the control signal is not activated.

25. The device of claim 24, wherein the first delay time is shorter than the second delay time.

26. The device of claim 24, wherein the delay circuit is a D flip flop for delaying the data write command signal for one period of the clock signal by being clocked by the clock signal.

27. The device of claim 24, the semiconductor memory device further comprises a command register for outputting the data read command signal or the data write command signal in response to a clock signal or a write enable signal.

28. A semiconductor memory device, comprising;

a column decoder for decoding addresses input in response to a timing control signal and generating column select signals corresponding to a decoding result;

a command register for outputting a data read command signal or a data write command signal in response to the command signal;

a delay circuit for delaying the clock signal for a first time or a second time in response to the data read command signal or the data write command signal;

a D flip-flop for delaying the data write command signal for one period of the clock signal;

a detecting circuit for receiving an output signal of the data read command signal and an output of the D flip flop and outputting a detecting signal; and an output circuit for outputting a timing control signal having a first delay time if the detecting signal is not activated, and for outputting a timing control signal having a second delay time if the detecting signal is activated.

29. The device of claim 28, wherein the first delay time is shorter than the second delay time.

30. The device of claim 28, wherein the command signal comprises the clock signal and a write enable signal.

* * * * *